United States Patent
Shin et al.

(10) Patent No.: US 7,844,359 B2
(45) Date of Patent: Nov. 30, 2010

(54) COATING AND DEVELOPING APPARATUS, OPERATING METHOD FOR SAME, AND STORAGE MEDIUM FOR THE METHOD

(75) Inventors: Tomonori Shin, Koshi (JP); Kouji Okamura, Koshi (JP); Tomohiro Kaneko, Koshi (JP); Akira Miyata, Koshi (JP); Syuzo Fujimaru, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 265 days.

(21) Appl. No.: 12/128,437

(22) Filed: May 28, 2008

(65) Prior Publication Data

US 2008/0299502 A1 Dec. 4, 2008

(30) Foreign Application Priority Data

May 29, 2007 (JP) ............................. 2007-142244

(51) Int. Cl.
*G06F 19/00* (2006.01)
*H01L 21/00* (2006.01)

(52) U.S. Cl. .............................. 700/121; 700/112; 438/5

(58) Field of Classification Search ................. 700/112, 700/114, 121; 702/81–84; 714/733, 724; 427/346, 595; 438/5; 355/27; 396/611; 356/237.5

See application file for complete search history.

(56) References Cited

U.S. PATENT DOCUMENTS

| 5,164,905 | A | * | 11/1992 | Iwasaki et al. | ............. 700/112 |
| 5,766,360 | A | * | 6/1998 | Sato et al. | .................... 118/666 |
| 6,112,130 | A | * | 8/2000 | Fukuda et al. | ............. 700/121 |
| 6,131,052 | A | * | 10/2000 | Ban et al. | .................... 700/121 |
| 6,281,962 | B1 | * | 8/2001 | Ogata et al. | .................... 355/27 |
| 6,405,094 | B1 | * | 6/2002 | Ueda et al. | ................. 700/112 |
| 6,568,847 | B2 | * | 5/2003 | Nishijima et al. | ............. 374/45 |
| 6,604,012 | B1 | * | 8/2003 | Cho et al. | .................... 700/121 |
| 6,670,568 | B2 | * | 12/2003 | Goetzke | ..................... 209/567 |
| 6,684,124 | B2 | * | 1/2004 | Schedel et al. | ............. 700/121 |
| 6,722,798 | B2 | * | 4/2004 | Senba et al. | ................. 396/611 |
| 6,728,588 | B2 | * | 4/2004 | Cho et al. | .................... 700/110 |
| 6,790,686 | B1 | * | 9/2004 | Purdy et al. | ................... 438/14 |

(Continued)

FOREIGN PATENT DOCUMENTS

JP 11-145052 5/1999

(Continued)

*Primary Examiner*—Albert DeCady
*Assistant Examiner*—Dave Robertson
(74) *Attorney, Agent, or Firm*—Oblon, Spivak, McClelland, Maier & Neustadt, L.L.P.

(57) ABSTRACT

In a coating and developing apparatus applied to liquid-immersion light exposure, substrates without an appropriately formed protective film can be recovered without adversely affecting normal-substrate processing efficiency, and in addition, removal of protective films can be simplified. In the coating and developing apparatus of the present invention, abnormal substrates not appropriately surface-coated with a protective film during liquid-immersion light exposure are queued in a queuing module, instead of being loaded into an exposure unit, and after the immediately preceding substrate has been unloaded from the exposure unit and loaded into a designated module, for example, a pre-developing second heating module, each abnormal substrate is loaded into the designated module in order to prevent so-called "scheduled transfer" from being affected, and a protective-film removing unit is also controlled to process the abnormal substrate.

13 Claims, 10 Drawing Sheets

U.S. PATENT DOCUMENTS

| | | | |
|---|---|---|---|
| 6,981,808 B2 * | 1/2006 | Miyata et al. | 396/611 |
| 6,985,788 B2 * | 1/2006 | Haanstra et al. | 700/121 |
| 7,128,481 B2 * | 10/2006 | Hashinoki | 396/611 |
| 7,141,120 B2 * | 11/2006 | Miyazaki | 118/719 |
| 7,241,061 B2 | 7/2007 | Akimoto et al. | |
| 7,267,497 B2 | 9/2007 | Akimoto et al. | |
| 7,372,561 B2 * | 5/2008 | Shibata et al. | 356/237.5 |
| 7,525,650 B2 * | 4/2009 | Shiga et al. | 356/237.5 |
| 7,599,545 B2 * | 10/2009 | Shibata et al. | 382/141 |
| 2003/0133086 A1 * | 7/2003 | Senba et al. | 355/27 |
| 2006/0134330 A1 * | 6/2006 | Ishikawa et al. | 427/248.1 |
| 2006/0164613 A1 * | 7/2006 | Akimoto et al. | 355/27 |
| 2007/0250202 A1 * | 10/2007 | Kaneko et al. | 700/121 |

FOREIGN PATENT DOCUMENTS

| | | |
|---|---|---|
| JP | 2000-82735 | 3/2000 |
| JP | 2005-32770 | 2/2005 |

* cited by examiner

FIG. 7

COATING AND DEVELOPING APPARATUS, OPERATING METHOD FOR SAME, AND STORAGE MEDIUM FOR THE METHOD

ROSS-REFERENCE TO RELATED APPLICATIONS

The present patent application benefits from Japanese Patent Application No. 2007-142244, filed on May 29, 2007, the content of which is hereby incorporated by reference in its entirety.

FIELD OF THE INVENTION

The present invention relates a coating and developing apparatus used to obtain a resist pattern by coating the surface of a substrate with a resist solution, then performing liquid-immersion light exposure upon the substrate, and developing the substrate that has undergone the liquid-immersion light exposure.

BACKGROUND OF THE INVENTION

During the manufacture of a semiconductor device or a liquid-crystal display (LCD), a resist pattern is generally formed by coating the surface of a substrate with a resist solution, then exposing the substrate to light using a required mask, and developing the substrate. In this case, the resist pattern is formed by a system that comprises a coating and developing apparatus which performs the coating process and developing process discussed above, and an exposure apparatus that is connected to the coating and developing apparatus and performs the exposure process discussed above.

Lithography for exposing a substrate to light with a liquid layer formed on the surface of the substrate in order to penetrate the light is present as the exposure technique used in the exposure apparatus of the above system. Hereafter, such an exposure technique is referred to as "liquid-immersion photolithography."

As shown in FIG. 10, such liquid-immersion photolithography uses the exposure means 1 that includes a supply port 11, a suction port 12, both provided in a peripheral section of the exposure means, and a lens 10 provided centrally therein. That is to say, pure water is supplied from the supply port 11 of the exposure means 1 to the surface of a wafer W, then the pure water is recovered via the suction port 12, and thus a liquid membrane (pure-water membrane) is formed between the surfaces of the lens 10 and the wafer W. Under this state, the wafer W is next illuminated with light via the lens 10. After this, the exposure means 1 is slid in a lateral direction to sequentially transfer required circuit patterns to the surface of the wafer W.

In the foregoing liquid-immersion photolithography, after the wafer W has been coated with a resist solution, a water-repellent protective film is formed on the surface of the wafer W in the protective-film coating module of the coating and developing apparatus before the liquid-immersion light exposure is performed. This protective film is formed to suppress the dissolution of the resist and to make it unlikely for the resist to remain on the surface of the wafer W during the liquid-immersion light exposure. Before the resist solution is developed following completion of the liquid-immersion light exposure, the protective film is removed in the protective-film removing module of the coating and developing apparatus (refer to JP-A-2006-229183).

Meanwhile, the coating and developing apparatus of the above system also has an inspection module. Before the liquid-immersion light exposure is performed, this inspection module inspects whether the protective film is appropriately formed on the entire surface of the wafer during the above film-forming process. If, during the inspection of the wafer surface by the inspection module, the protective film is judged not appropriately formed on the wafer surface, this wafer (hereinafter, referred to as a defective wafer) needs to be returned to an associated carrier without being subjected to the liquid-immersion light exposure. Examples of such a defective wafer include a wafer that has a protective film formed on the entire surface but has the protective film extending so far as to reach the edge, or a wafer that has a section(s) on the surface where the protective film is not formed.

For example, if the liquid-immersion light exposure is performed upon a wafer having a protective film adhering to the edge, when the wafer is held in a transfer arm, the film at the edge peels off at the contact surface. As a result, the film that has peeled off diffuses foreign matter, thus contaminating the wafer, the lens, and the like. In addition, if the liquid-immersion light exposure is performed upon a wafer that has a section(s) where the protective film is not formed on the surface thereof, the resist on the wafer dissolves and adheres to the surface of the lens 10 of the exposure means 1 shown in FIG. 10. The resist that has thus adhered damages the lens 10 and shortens the service life of the exposure apparatus.

It is described in JP-A-2005-32770 that an abnormal substrate, such as a substrate on which resist coating has failed, is queued in the buffer of an interface unit. It is also described that after the substrate immediately preceding the abnormal substrate has been unloaded from the exposure apparatus, the abnormal substrate is carried to a required module, as with the normal substrate, and that after being carried to the module, the abnormal substrate is not processed in the module.

However, if the abnormal substrate falls into the category of the defective wafers discussed above, since a protective film is already formed on the surface of the defective wafer which has been returned to the carrier, reusing this wafer requires removing the protective film formed on the surface of the wafer. The protective film is removed by a protective-film removing device provided separately from the coating and developing apparatus. For this reason, independent carriage only of the defective wafer to the protective-film removing device is necessitated and subsequent process operations become troublesome.

Patent Document 1: JP-A-2006-229183
Patent Document 2: JP-A-2005-32770

SUMMARY OF THE INVENTION

The present invention has been made under these circumstances, and an object of the invention is to provide a coating and developing apparatus connected to an exposure apparatus which performs liquid-immersion light exposure, the apparatus being adapted to recover substrates not appropriately surface-coated with a protective film, without reducing normal-substrate processing efficiency, and to simplify a protective-film removing operation.

The coating and developing apparatus according to the present invention comprises: a resist-coating module that coats the surface of a substrate with a resist; a protective-film coating module provided at a downstream side relative to the resist-coating module, the protective-film coating module being adapted such that the resist film formed on the surface of the substrate is surface-coated with a chemical for forming a protective film to protect the surface of the substrate; an inspection module provided at a downstream side relative to the protective-film coating module, the inspection module being adapted to inspect a coating state of the chemical in the protective-film coating module; a queuing module provided at a downstream side relative to the inspection module, the queuing module being adapted to queue the substrate; a protective-film removing module provided at a downstream side relative to the queuing module, the protective-film removing module being adapted to remove the protective film from the substrate upon which a light exposure unit has performed liquid-immersion light exposure with a liquid layer formed on the surface of the substrate; a developing module provided at a downstream side relative to the protective-film removing module, the developing module being adapted to develop the substrate by supplying a developing solution to the substrate from which the protective film has been removed; substrate transfer means for sequentially transferring the substrate from an upstream module, towards a downstream module, between the above modules that constitute the apparatus; and a controller connected to each of the modules and to the substrate transfer means, the controller being adapted to control the substrate transfer means in accordance with the coating state of the chemical that has been inspected in the inspection module; wherein, if an abnormal substrate is detected in the inspection module and transferred to the queuing module, the controller controls the queuing module to queue the abnormal substrate, and after a substrate immediately preceding the abnormal substrate in terms of transfer priority level has been unloaded from the exposure unit and loaded into a previously designated module present at an upstream side relative to the protective-film removing module, the controller controls the substrate transfer means to transfer the abnormal substrate from the queuing module to the designated module; and wherein the controller further controls the substrate transfer means to subsequently maintain the transfer priority levels of the immediately preceding substrate and the abnormal substrate, and controls the protective-film removing module to remove a protective film from the abnormal substrate in the protective-film removing module.

In the modules located downstream with respect to the inspection module, the controller in the coating and developing apparatus preferably controls each module, except for the protective-film removing module, not to perform processing of the abnormal substrate. Also, the queuing module is preferably a buffer unit provided to adjust any differences between a substrate-processing speed of each module at an upstream side of the exposure unit and a substrate-processing speed of the exposure unit itself.

In addition, the coating and developing apparatus preferably has a first heating module between the protective-film coating module and the inspection module in order to heat the protective film on the substrate. In this case, the controller preferably controls the first heating module not to perform the heating process upon an abnormal substrate whose abnormality has been detected during processing in the protective-film coating module. Furthermore, the designated module is preferably a second heating module provided at an upstream side relative to the developing module in order to heat the substrate prior to the development thereof in the developing module. Moreover, the controller preferably controls the protective-film removing module not to perform the protective-film removal process upon an abnormal substrate which the inspection module has judged not to have the required protective film at all.

Another aspect of the present invention is a method of operating a coating and developing apparatus which includes
a resist-coating module that coats the surface of a substrate with a resist, a protective-film coating module provided at a downstream side relative to the resist-coating module such that the resist film formed on the surface of the substrate is surface-coated with a chemical for forming a protective film to protect the surface of the substrate, an inspection module provided at a downstream side relative to the protective-film coating module in order to inspect a coating state of the chemical in the protective-film coating module, a queuing module provided at a downstream side relative to the inspection module in order to queue the substrate, a protective-film removing module provided at a downstream side relative to the queuing module in order to remove the protective film from the substrate upon which a light exposure unit has performed liquid-immersion light exposure with a liquid layer formed on the surface of the substrate, a developing module provided at a downstream side relative to the protective-film removing module in order to develop the substrate by supplying a developing solution to the substrate from which the protective film has been removed, substrate transfer means for sequentially transferring the substrate from an upstream module, towards a downstream module, between the above modules that constitute the apparatus, and a controller connected to each of the modules and to the substrate transfer means in order to control the substrate transfer means in accordance with the coating state of the chemical that has been inspected in the inspection module, the operating method comprising the steps of: coating the surface of the substrate with the resist in the resist-coating module; coating, in the protective-film coating module, the resist film formed on the surface of the substrate, with a chemical for forming a protective film to protect the surface of the substrate; inspecting in the inspection module the coating state of the chemical in the protective-film coating module; queuing the substrate in the queuing module; removing the protective film from the substrate in the protective-film removing module after liquid-immersion light exposure has been performed in the exposure unit with a liquid layer formed on the surface of the substrate; and developing the substrate by supplying the developing solution to the substrate from which the protective film has been removed; wherein, if an abnormal substrate is detected in the inspection module and transferred to the queuing module, the controller controls the queuing module to queue the abnormal substrate, and after a substrate immediately preceding the abnormal substrate in terms of transfer priority level has been unloaded from the exposure unit and loaded into a previously designated module present at the upstream side relative to the protective-film removing module, the controller controls the substrate transfer means to transfer the abnormal substrate from the queuing module to the designated module; and wherein the controller further controls the substrate transfer means to subsequently maintain the transfer priority levels of the immediately preceding substrate and the abnormal substrate, and controls the protective-film removing module to remove a protective film from the abnormal substrate in the protective-film removing module.

A storage medium which contains a computer program that operates on a computer, the computer program being used in a method of operating a coating and developing apparatus including a resist-coating module that coats the surface of a substrate with a resist, a protective-film coating module provided at a downstream side relative to the resist-coating module such that the surface of the resist film formed on the surface of the substrate is coated with a chemical for forming a protective film to protect the surface of the substrate, an inspection module provided at a downstream side relative to the protective-film coating module in order to inspect a coating state of the chemical in the protective-film coating module, a queuing module provided at a downstream side relative to the inspection module in order to queue the substrate, a protective-film removing module provided at a downstream side relative to the queuing module in order to remove the protective film from the substrate upon which a light exposure unit has performed liquid-immersion light exposure with a liquid layer formed on the surface of the substrate, a developing module provided at a downstream side relative to the protective-film removing module in order to develop the substrate by supplying a developing solution to the substrate from which the protective film has been removed, substrate transfer means for sequentially transferring the substrate from an upstream module, towards a downstream module, between the above modules that constitute the apparatus, and a controller connected to each of the modules and to the substrate transfer means in order to control the substrate transfer means in accordance with the coating state of the chemical that has been inspected in the inspection module, the operating method comprising the steps of: coating the surface of the substrate with the resist in the resist-coating module; coating, in the protective-film coating module, the resist film formed on the surface of the substrate, with a chemical for forming a protective film to protect the surface of the substrate; inspecting in the inspection module the coating state of the chemical in the protective-film coating module; queuing the substrate in the queuing module; removing the protective film from the substrate in the protective-film removing module after liquid-immersion light exposure has been performed in the exposure unit with a liquid layer formed on the surface of the substrate; and developing the substrate by supplying the developing solution to the substrate from which the protective film has been removed; wherein, if an abnormal substrate is detected in the inspection module and transferred to the queuing module, the controller controls the queuing module to queue the abnormal substrate, and after a substrate immediately preceding the abnormal substrate in terms of transfer priority level has been unloaded from the exposure unit and loaded into a previously designated module present at the upstream side relative to the protective-film removing module, the controller controls the substrate transfer means to transfer the abnormal substrate from the queuing module to the designated module; and wherein the controller further controls the substrate transfer means to subsequently maintain the transfer priority levels of the immediately preceding substrate and the abnormal substrate, and controls the protective-film removing module to remove a protective film from the abnormal substrate in the protective-film removing module.

According to the present invention, an abnormal substrate not appropriately surface-coated with the protective film for liquid-immersion light exposure is queued in the queuing module, instead of being loaded into the exposure unit. After the substrate immediately preceding the abnormal substrate in terms of transfer priority level has been unloaded from the exposure unit and loaded into the previously designated module, for example, a heating module existing before the immediately preceding substrate is developed, the abnormal substrate is adapted to be loaded into the previously designated module. This prevents so-called "scheduled transfer" from being affected, and in addition, since the abnormal substrate also has its protective film removed by the protective-film removing unit, the abnormal substrate does not require removal of the protective film after being recovered and returned to the carrier.

BRIEF DESCRIPTION OF THE DRAWINGS

FIG. 7 is an explanatory diagram showing an example of a transfer schedule relating to an embodiment of the present invention;

DESCRIPTION OF THE PREFERRED EMBODIMENTS

Figure 1:
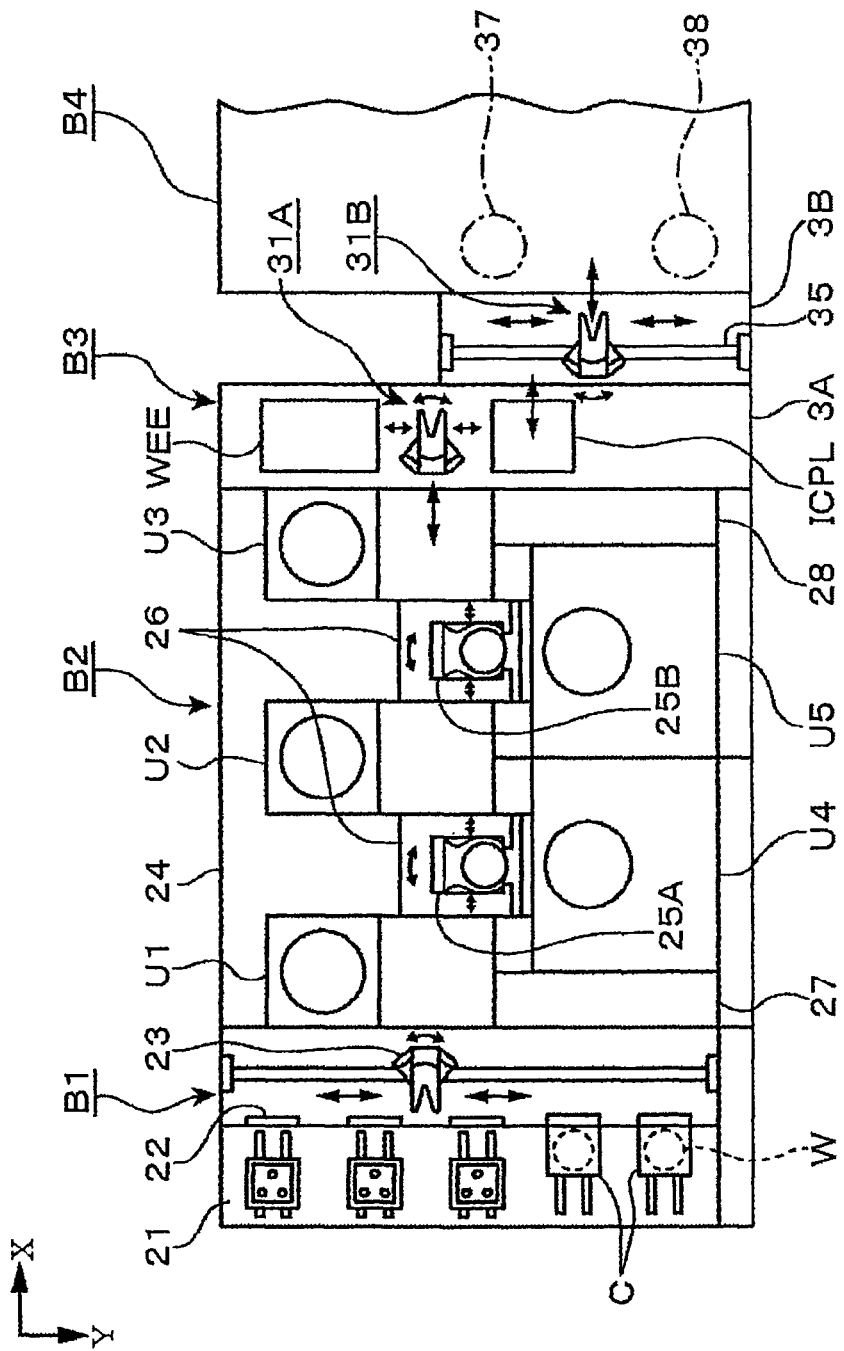
FIG. 1 is a plan view showing an embodiment of a coating and developing apparatus according to the present invention.
Figure 2:
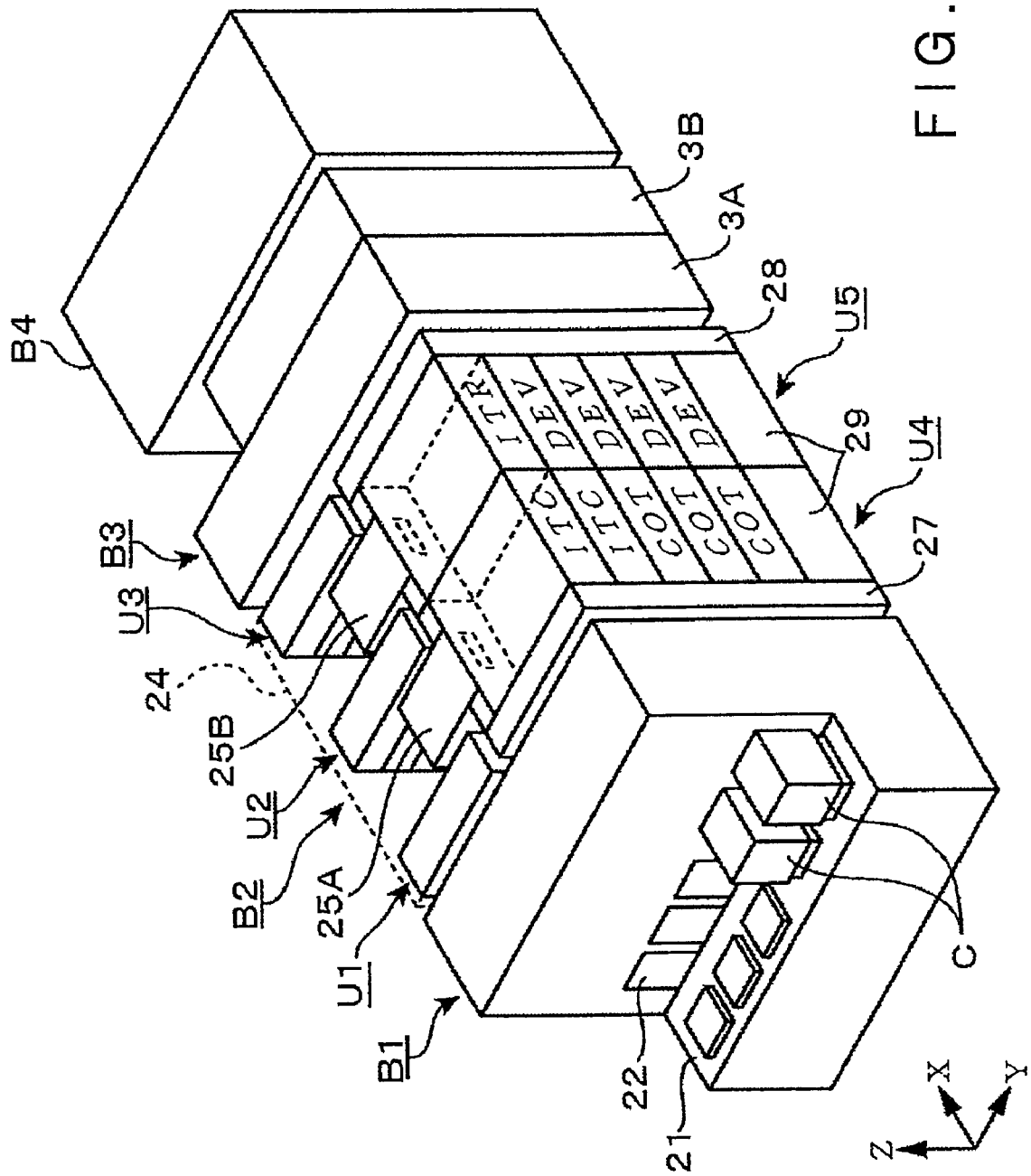
FIG. 2 is a perspective view showing the coating and developing apparatus.

A total system configuration with a coating and developing apparatus according to an embodiment of the present invention, and with a light exposure apparatus connected to the coating and developing apparatus, is described below referring to FIGS. 1 and 2. FIG. 1 is a plan view showing the coating and developing apparatus according to the present embodiment, and FIG. 2 is a perspective view of the coating and developing apparatus. Reference number B1 in FIGS. 1 and 2 denotes a carrier-mounting table used to load and unload a carrier C in which 13 wafers W, for example, are stored as substrates in a hermetically sealed condition. The carrier-mounting table B1 contains, as shown, a mounting table 21 with a mounting capacity of multiple carriers C, an openable/closable section 22 present on a front wall of the table B1 when viewed therefrom, and a transfer arm 23 for unloading a wafer W from the carrier C via the openable/closable section 22.

A processing block B2 surrounded with an enclosure 24 is connected to a rear end of the carrier-mounting table B1. Three rack modules (from the left of the drawing in order, U1, U2, and U3) that are each formed into a multistage-stacked heating/cooling module arrangement, and main transfer mechanisms 25A and 25B that are each a transfer unit constructed to be able to move forward and backward, move vertically, and rotate about a perpendicular pivot, in order to transfer the wafer W between modules including non-heating/cooling modules, are arrayed in positionally alternate fashion in the carrier-mounting table B2. That is to say, the rack modules U1, U2, U3, and the main transfer mechanisms 25A, 25B are arrayed in a row in a longitudinal direction of the carrier-mounting table B1 when viewed therefrom, and an opening (not shown) for transferring the wafer is formed at each of associated connection, so that the wafer W can be freely moved from the rack module U1 in one end of the processing block B2 to the rack module U3 in the other end of the block B2. The main transfer mechanisms 25A, 25B have their driving controlled by a controller under commands from a control unit (described later herein).

The main transfer mechanisms 25A, 25B are arranged in a space surrounded by partition walls 26 constituted by one face of the racks U1, U2, U3 existing in the longitudinal direction of the carrier-mounting table B1 when viewed therefrom, one face of chemical processors U4 and U5 located at rear right positions of the carrier-mounting table B1 when viewed therefrom, and a rear panel that forms one face located at rear left positions of the carrier-mounting table B1 when viewed therefrom. The main transfer mechanisms 25A, 25B each have a plurality of arms (e.g., three arms) in a liftable and horizontally pivotable arm mechanism, and the plurality of arms are each constructed to be independently movable forward and backward. Reference numbers 27 and 28 in FIG. 2 denote temperature/humidity control modules each having elements such as a temperature controller and temperature/humidity control duct for the processing chemicals used in each module.

As shown in FIG. 2, the chemical processors U4, U5 are each constructed, for example, by combining various modules, such as the coating module (COT), developing module (DEV), protective-film coating module (ITC), and protective-film removing module (ITR), into a multi-stage, for example, five-stage stacked arrangement on a storage unit 29 which forms a space for supplying a coating solution (resist solution), a developing solution, a protective-film forming chemical, and a protective-film separating chemical. The protective-film coating module (ITC) is constructed so that the surface of the wafer W with a resist film formed thereon will be coated with a protective-film forming solution containing a water-repellent material (e.g., a fluorine-based solvent). The protective-film removing module (ITR) is used to remove the protective film formed on the surface of the wafer W. The racks U1, U2, U3 described above are each constructed by stacking various modules into a multi-stage, for example, ten-stage arrangement for performing a pre-process and post-process in the chemical processors U4, U5.

Figure 3:
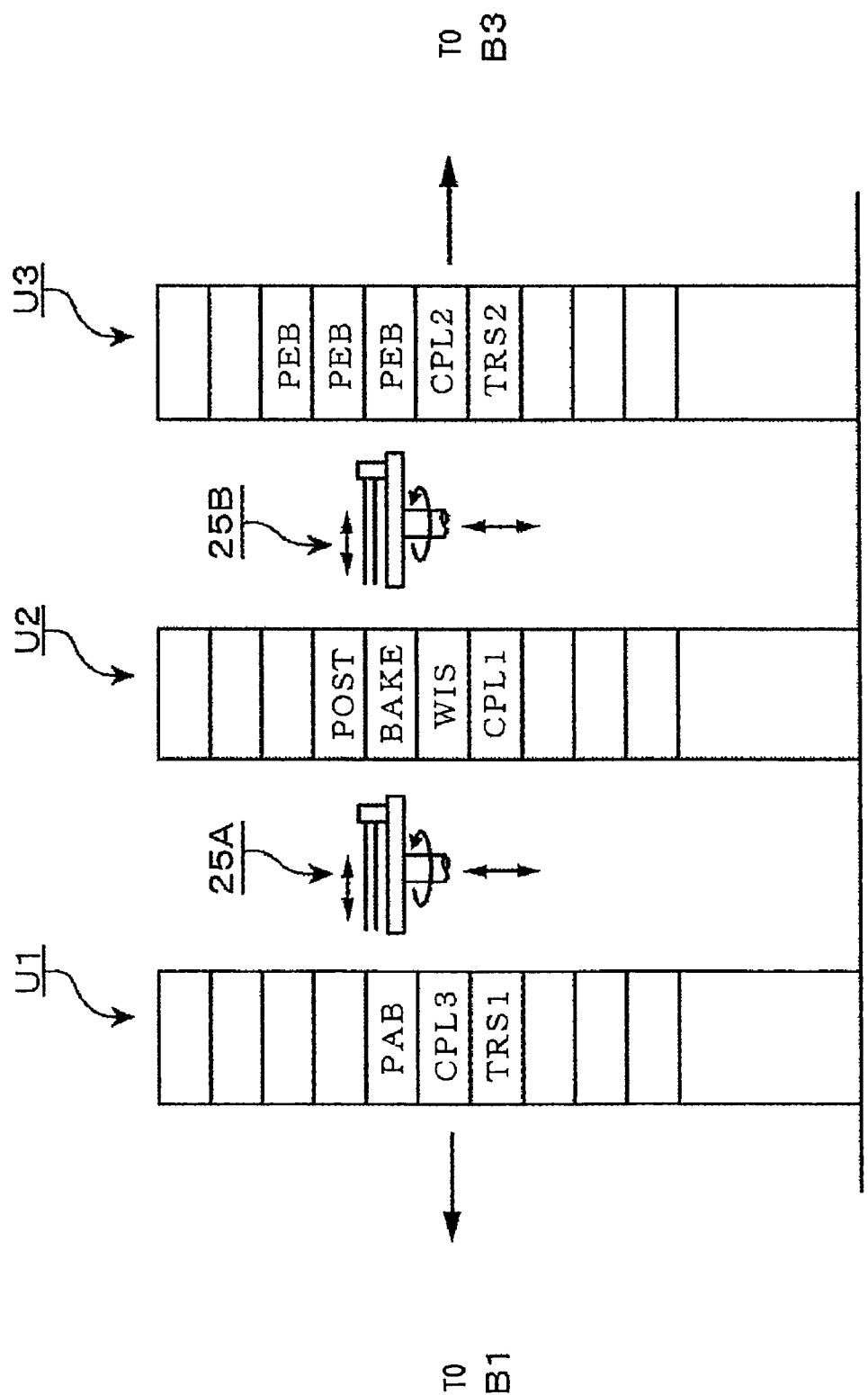
FIG. 3 is a side view showing a structure of a rack section in the coating and developing apparatus.

For example, as shown in FIG. 3, the modules for performing the pre-process and post-process mentioned above include: a heating module (PAB), called a prebaking module, for heating the wafer W after resist solution coating; a heating module (BAKE) for heating the wafer W after protective film coating; an inspection module (WIS) for inspecting whether a protective film is formed on the surface of the wafer W; a temperature control module (CPL1) for controlling temperature to a required value before exposure is performed; a heating module (PEB), called a post-exposure baking module, for heating the wafer W after exposure; a temperature control module (CPL2) for controlling temperature to a required value before the developing process is performed; a heating module (POST), called a post-baking module, for heating the wafer W after development; a temperature control module (CPL3) for cooling the wafer W that has been heated by the heating module (POST); and so on.

FIG. 3 shows an example of layout of these modules. The layout in FIG. 3 is for convenience sake only, and in an actual apparatus, the number of modules arranged is determined considering a processing time and other factors of each module. Also, the racks U1, U2, U3 each include, for example, a transfer module (TRS1 or TRS2) having a table to transfer the wafer W, as shown in FIG. 3.

Figure 4:
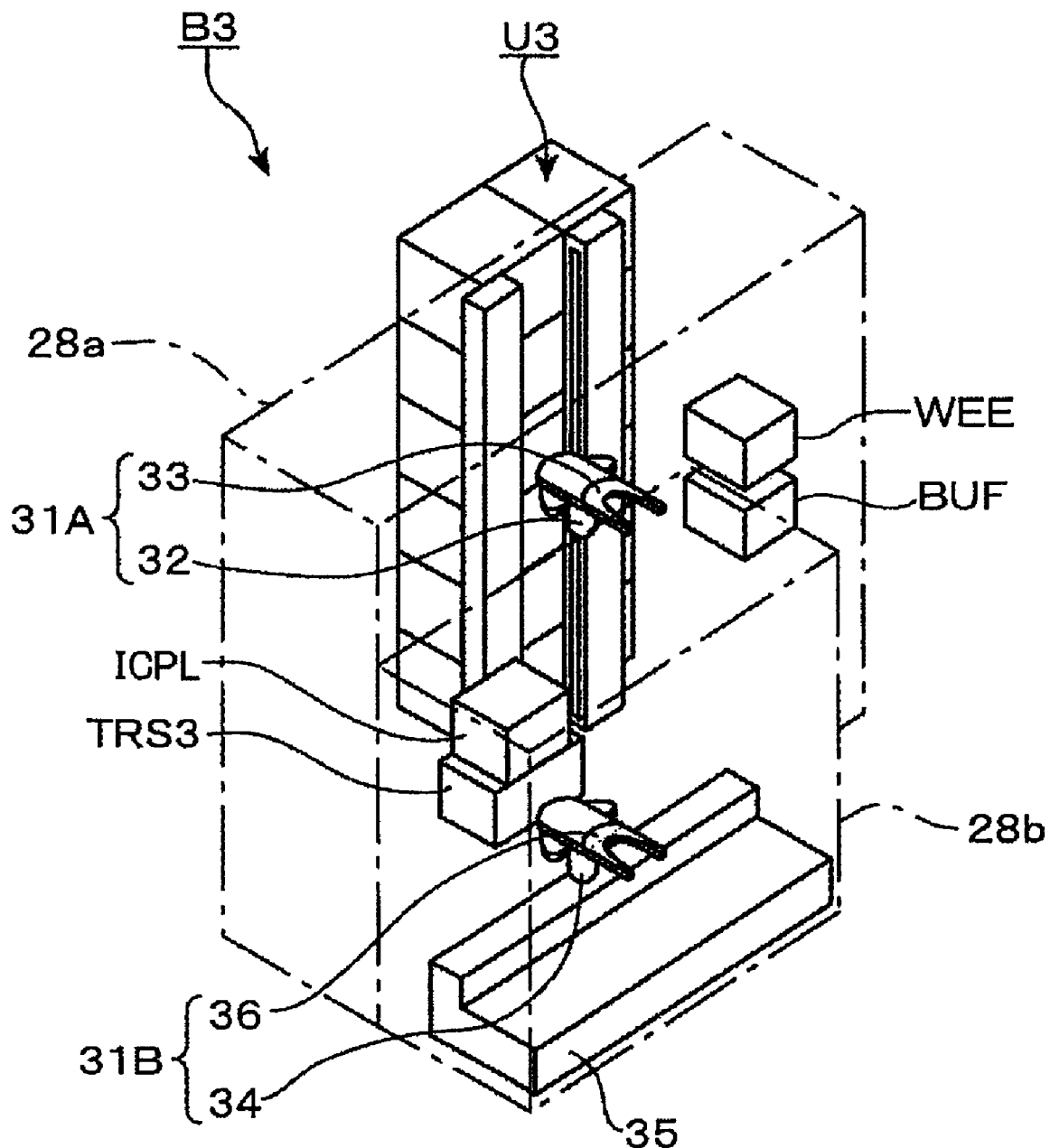
FIG. 4 is a schematic perspective view showing an interface unit in the coating and developing apparatus.

An exposure device B4 is connected to a rear side of the rack U3 in the above-described processing block B2 via an interface unit B3. As shown in FIG. 4, the interface unit B3 includes a first transfer chamber 28a and a second transfer chamber 28b, both provided close to each other between the processing block B2 and the exposure device B4, and the first transfer chamber 28a and the second transfer chamber 28b contain a main transfer section 31A and an auxiliary transfer section 31B, respectively. The main transfer section 31A and the auxiliary transfer section 31B form a substrate transfer unit. The main transfer section 31A includes a vertically movable and perpendicularly pivotable base member 32 and an arm 33 provided thereon so as to be able to move forward and backward. The auxiliary transfer section 31B is constructed so that a vertically movable and perpendicularly pivotable base member 34 can be moved in a horizontal direction by an action of a guide member 35, and further has an arm 36 on the base member 34, the arm 36 being able to be moved forward and backward. The main transfer section 31A and the auxiliary transfer section 31B have their driving controlled under commands from the control unit described later herein. In the first transfer chamber 28a, a wafer edge exposure device (WEE) for selectively exposing only an edge of the wafer W to light, and a buffer cassette (BUF) for primary/temporary storage of a plurality of, for example, 25 wafers W, are arranged at the left of the main transfer section 31A when viewed from the carrier station B1. A transfer module (TRS3) having a table for transferring each wafer W, and a high-precision temperature control module (ICPL) disposed on the transfer module (TRS3) and having a cooling plate are arranged at the right of the main transfer section 31A when viewed from the carrier station B1.

Next, a brief structural explanation of the protective-film coating module (ITC) and the protective-film removing module (ITR) is briefly made below using FIGS. 5A, 5B. Both modules are essentially of the same structure, so the protective-film removing module 6(ITR) is first explained by way of example. Reference number 51 in FIG. 5A denotes a spin chuck that forms a substrate hold unit, the spin chuck 51 being constructed to hold the wafer W horizontally by vacuum chucking. The spin chuck 51 is actuated by a drive 52 so as to be rotatable about a perpendicular pivot and vertically movable. Around the spin chuck 51, a cup 53 that encircles a lateral section spanning the spin chuck 51 from the wafer W is provided, and at the bottom of the cup 53, an exhaust section that includes an exhaust pipe 54, a drain pipe 55, and the like, is provided.

Figure 5A:
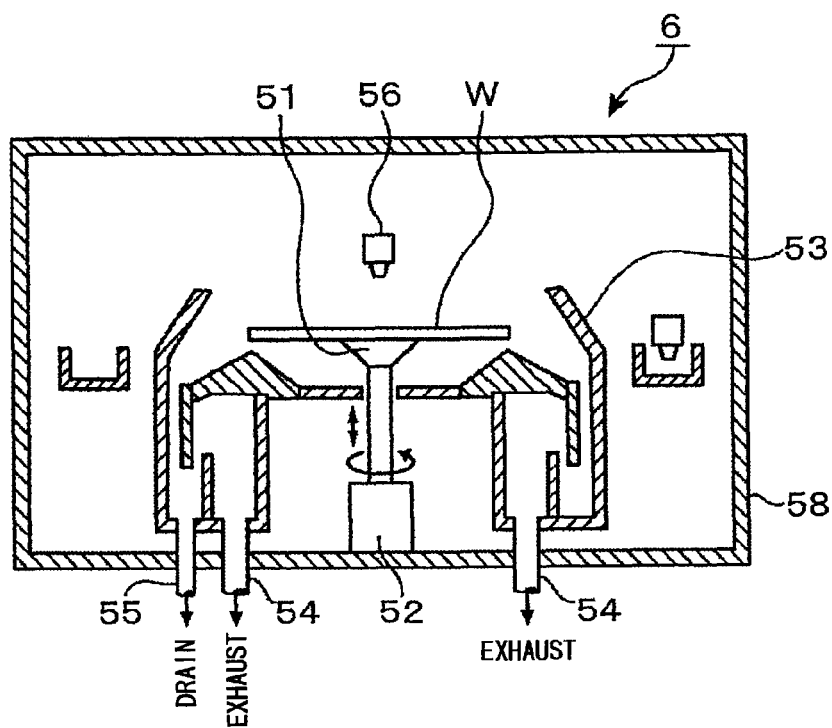
FIG. 5A is a longitudinal cross-sectional view showing an example of a protective-film removing module in the coating and developing apparatus.
Figure 5B:
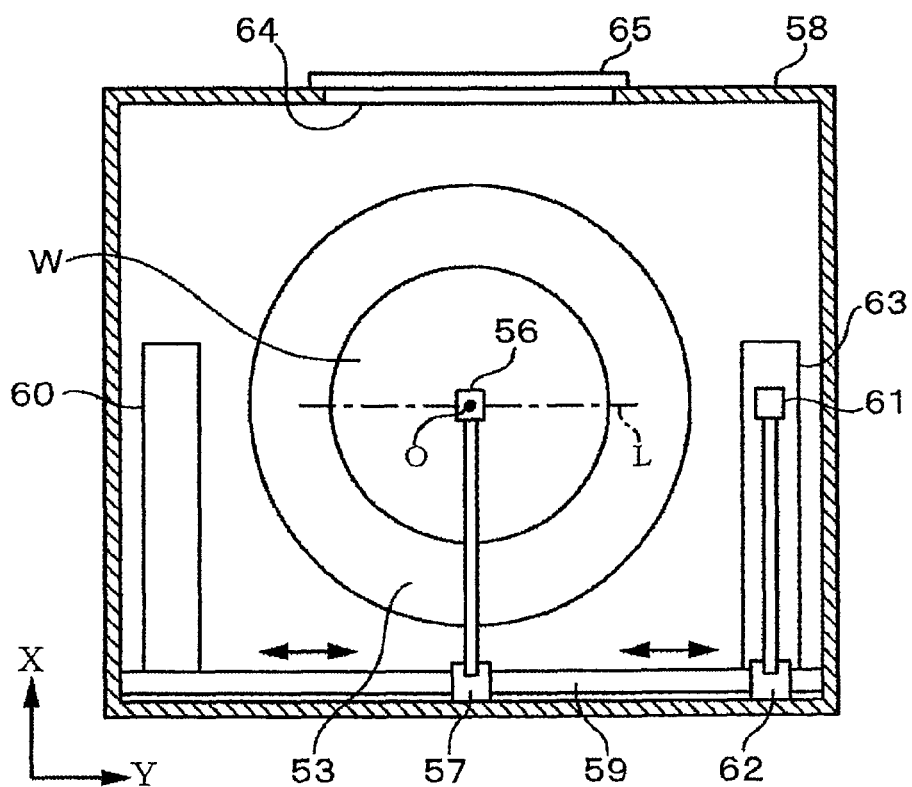
FIG. 5B is a plan view showing an example of a protective-film removing module in the coating and developing apparatus.

Reference number 56 in FIGS. 5A, 5B denotes a chemical-liquid supply nozzle for supplying a protective-film separating liquid to essentially a rotational center of the wafer W. The chemical-liquid supply nozzle 56 is constructed so that a slider 57 can move this nozzle between a queuing region 60 provided outward with respect to one edge of the cup 53, and a position for supplying the separating liquid to essentially the rotational center of the wafer W, along a guide rail 59 provided in a lengthwise direction (Y-direction) of a processing container 58. The chemical-liquid supply nozzle 56 is also constructed to be vertically movable.

Reference number 61 in FIG. 5B denotes a cleaning nozzle for supplying a cleaning liquid to essentially the rotational center of the wafer W. The cleaning nozzle 61 is constructed so that a slider 62 can move this nozzle along the guide rail 59, between a queuing region 63 provided outward with respect to the other edge of the cup 53, and a position for supplying the cleaning liquid to essentially the rotational center of the wafer W. The cleaning nozzle 61 is also constructed to be vertically movable. Reference number 64 in FIG. 5B denotes a wafer W loading/unloading port formed on the position of the processing container 58 that faces a transfer region of the main transfer mechanism 25B, and an openable/closable shutter 65 is provided on the loading/unloading port 64.

In the protective-film removing module 6, the wafer W is loaded into the processing container 58 via the loading/unloading port 64 by the main transfer mechanism 25B, and then delivered to the spin chuck 51. After this, the separating liquid for removing the protective film is supplied from the chemical-liquid supply nozzle 56 to essentially the rotational center of the wafer W. In addition, the spin chuck 51 is caused to spin for spreading the separating liquid in a radial direction of the wafer W by centrifugal force. In this way, the separating liquid is supplied to the entire protective film on the surface of the wafer W, thus separating the protective film therefrom.

After this, the chemical-liquid supply nozzle 56 is moved to the queuing region 60, and meanwhile, the cleaning nozzle 61 is moved to the position for supplying the cleaning liquid to essentially the rotational center of the wafer W. Thus, the cleaning liquid is supplied to essentially the rotational center of the wafer W. In addition, the spin chuck 51 is caused to spin. This spreads the cleaning liquid in the radial direction of the wafer W by centrifugal force, whereby the protective film that has been separated from the surface of the wafer W is cleaned away by the cleaning liquid. After this, the wafer W is rotated at high speed, and after the cleaning liquid on the surface of the wafer W has been dried, the wafer is carried out from the protective-film removing module 6 via the loading/unloading port 64 by the main transfer mechanism 25B.

The protective-film coating module 5 supplies a protective-film forming chemical from the chemical-liquid supply nozzle 56 to the surface of the wafer W, and is constructed similarly to the protective-film removing module 6, except that the cleaning nozzle 61 is not provided. In addition to supplying the protective-film forming chemical to essentially the rotational center of the wafer W from the chemical-liquid supply nozzle 56, the protective-film coating module 5 spins the spin chuck 51. This spreads the chemical in the radial direction of the wafer W by centrifugal force, thus forming a liquid film of the chemical as a protective film on the surface of the wafer W.

Figure 6:
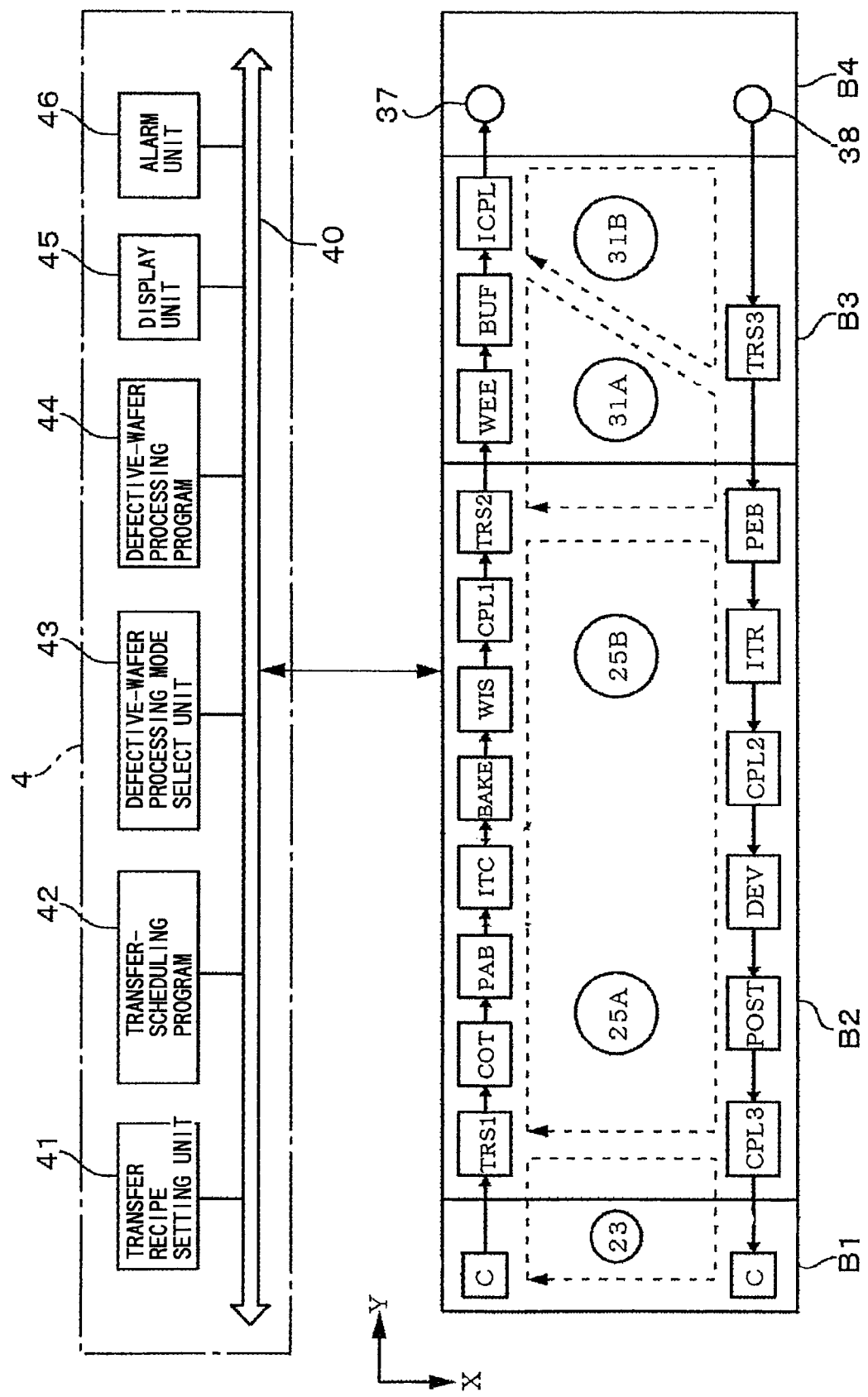
FIG. 6 is a plan view showing an example of a wafer transfer route and controller in the coating and developing apparatus.

As shown in FIG. 6, the coating and developing apparatus further has a control unit 4 to control the driving of the foregoing main transfer mechanisms 25A, 25B, main transfer section 31A, and auxiliary transfer section 31B, and control each processing module. The control unit 4 is detailed below. Reference number 40 in FIG. 6 denotes a bus, to which are connected a transfer recipe setting unit 41, a transfer-scheduling program 42, a defective-wafer processing mode setting unit 43, a defective-wafer processing program 44, a display unit 45, an alarm unit 46, a CPU not shown, and the like. In FIG. 6, these elements are shown in block form for functional representation.

Before various sections of the control unit 4 are described, wafer transfer between modules is discussed below. That is to say, in the coating and developing apparatus, a wafer W is mounted in each of the coating module (COT), the developing module (DEV), the heating modules (PAB, PEB, POST, BAKE), the temperature control modules (CPL1, CPL2, CPL3, ICPL), the transfer modules (TRS1, TRS2, TRS3), the protective-film coating module (ITC), the wafer inspection module (WIS), the protective-film removing module (ITR), the wafer edge exposure device (WEE), the buffer cassette (BUF), and the like. These modules are equivalent to a module group predetermined in wafer transfer sequence. The transfer arm 23, the main transfer mechanisms 25A, 25B, the main transfer section 31A, and the auxiliary transfer section 31B access the module group and pick one wafer W from a loaded carrier C. The module, after receiving a wafer W from the immediately following module in accordance with predetermined priority levels delivers a preceding wafer W to the immediately following module. In this way, one transfer cycle is executed to transfer wafers W sequentially from one module within the module group to another module in accordance with the transfer priority level.

Attention is returned to the description of the control unit 4 in FIG. 6. The foregoing transfer recipe setting unit 41 has a function for setting the modules into which all wafers W of a particular product lot are to be loaded, and assigning the order of priority for the transfer to each of the modules. The foregoing transfer-scheduling program 42 creates a wafer W transfer schedule (see FIG. 7) that is based on a transfer recipe that the transfer recipe setting unit 41 has created. The foregoing defective-wafer processing mode select unit 43 has: (a) a function which, if an error signal is output from the protective-film coating module (ITC), selects whether the wafer W in the protective-film coating module (ITC) is to be heated after being transferred to next heating module (BAKE), and (b) a function which, for any wafers W that has been judged abnormal by the inspection module (WIS), selects either a mode in which to perform a protective-film removing process upon all wafers W that have been judged abnormal, irrespective of whether the wafer W has been defective in the protective-film removing module (ITR), or a mode in which not to perform the protective-film removing process upon, among all wafers W that have been judged abnormal, only those which do not have a protective film at all on the surface.

Figure 8:
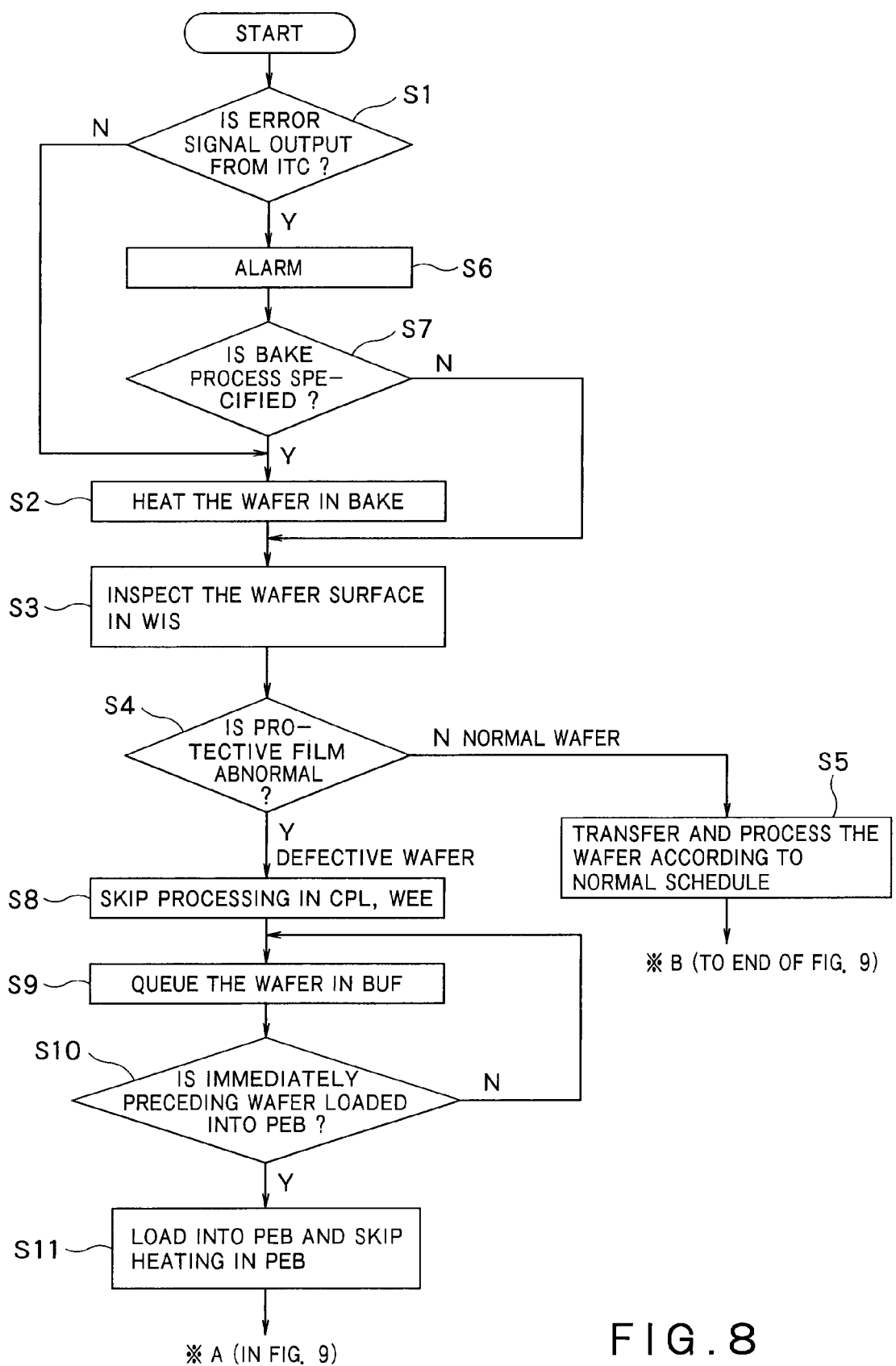
FIG. 8 is a flow diagram showing a flow of operational steps in an embodiment of the present invention.
Figure 9:
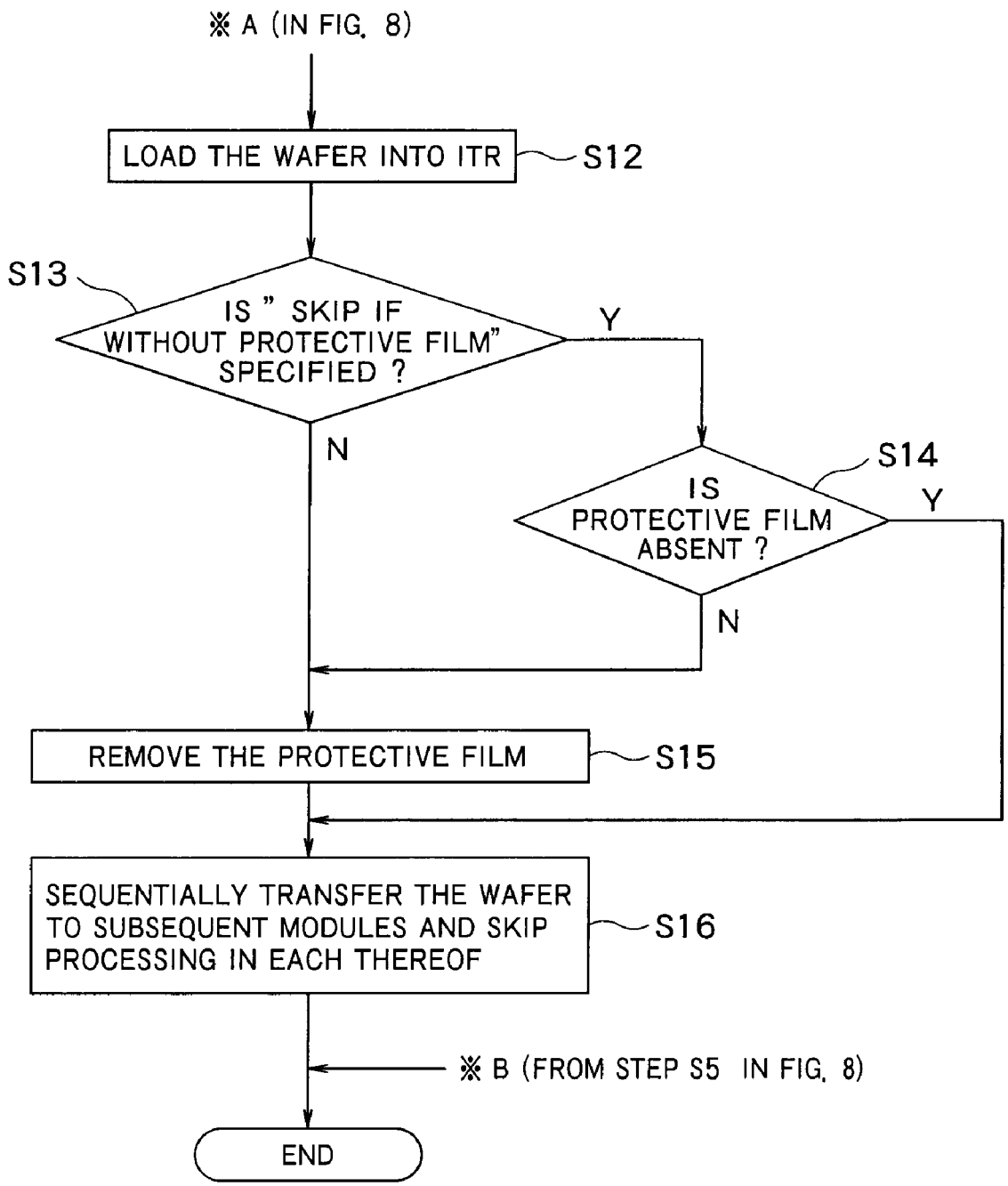
FIG. 9 is another flow diagram showing a flow of operational steps in an embodiment of the present invention.
Figure 10:
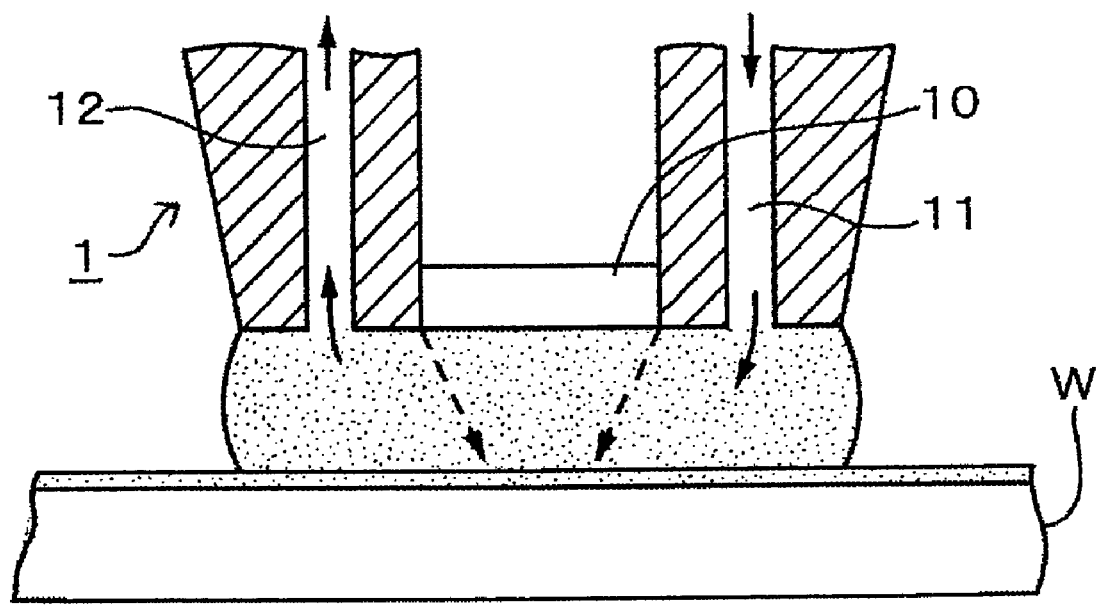
FIG. 10 is an explanatory diagram that shows exposure means used for liquid-immersion light exposure of a wafer.

In the defective-wafer processing program 44, steps are set up to be executed in accordance with the flow diagrams shown in FIGS. 8 and 9. The defective-wafer processing program 44 is stored into a storage medium, for example, a flexible disk (FD), a memory card, a compact disk (CD), a magneto-optical disk (MO), or the like, and installed in a computer that is the control unit 4.

The foregoing display unit 45 is formed up of combinations of software switches displayed on, for example, a liquid-crystal screen, a CRT screen, or the like, and displays various data. The foregoing alarm unit 46 generates alarms to inform an operator that an error has occurred in the protective-film coating module (ITC).

Figure 7:
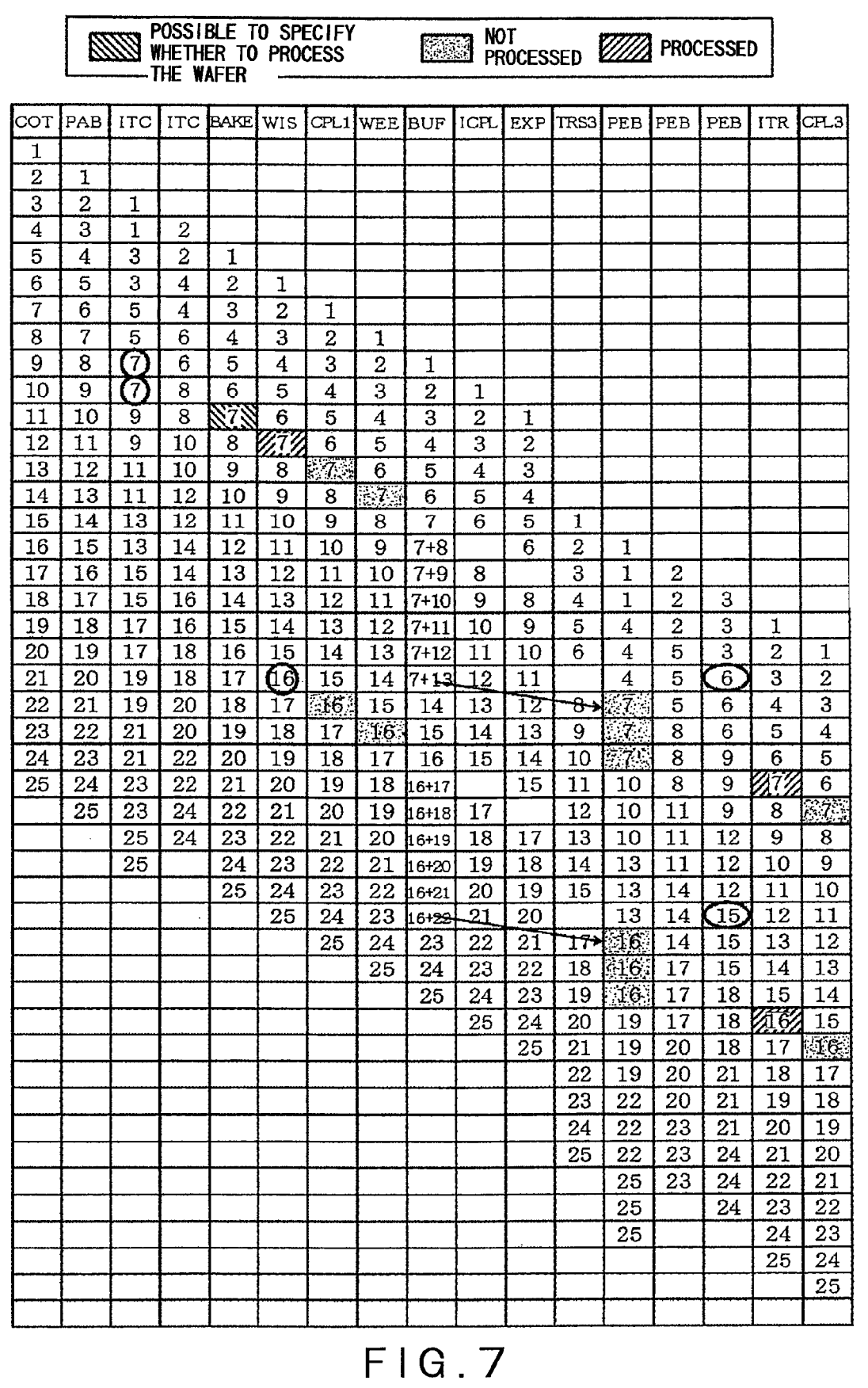

Operation of the present embodiment is next described. First, the operator assigns a transfer recipe. Based on this recipe, the transfer schedule shown in FIG. 7 is set up. The wafers W in the carrier C are then picked in order by the transfer arm 23 as shown in FIG. 6. Each wafer W is transferred to the main transfer mechanism 25A via the transfer module (TRS1), and undergoes, for example, hydrophobicizing and/or cooling as a precoating process in one of the racks U1 to U3. This is followed by formation of a resist film on the surface of the wafer W in the coating module (COT), and further followed by transfer of the wafer W to the heating module (PAB), in which the wafer is then heated by baking. The heated wafer W is next transferred to the protective-film coating module (ITC). Wafer processing in the protective-film coating module (ITC) onward will be described referring to the transfer schedule shown in FIG. 7, and to the flowcharts shown in FIGS. 8 and 9. Part of the modules incorporated into an actual apparatus is omitted from each of the figures.

The transfer schedule shown in FIG. 7 indicates in what modules, in the present example, 25 wafers (wafers 1 to 25) are placed at what points of time. Also, one horizontal row is equivalent to one transfer cycle, and transfer cycles are arranged vertically in chronological order. The horizontal row is called a phase or the like, and indicates in what modules the wafers (1 to 25) will be placed when these wafers are sequentially transferred, one at a time, from an upstream module (in the present example, TRS1) to the module of the next highest priority level in order by the main transfer mechanisms 25A, 25B, the main transfer section 31A, and the auxiliary transfer section 31B. In the horizontal rows of the transfer schedule shown in FIG. 7, of all modules shown in FIG. 6, only those necessary for the description of the present invention are listed because of the limited space in the drawing.

First, it is judged in step S1 whether an error signal has been output from the protective-film coating module (ITC) following completion of the transfer of each wafer (1-25) to this module. If the protective-film coating module (ITC) is in a normal operational state, since an error signal is not output, the wafer 1-25 in the protective-film coating module (ITC) is transferred to a heating module (BAKE) by the main transfer mechanism 25A and heated in the BAKE module in step S2. The wafer 1-25 that has been heated is further transferred to the inspection module (WIS) by the main transfer mechanism 25A and inspected in the WIS module in step S3. At this stage, whether a protective film is appropriately formed on the entire surface of the wafer 1-25 is judged in step S4. If the wafer is a normal one having an appropriately formed protective film, the wafer is transferred according to normal transfer schedule and required processing in each module to which the wafer has been transferred is performed in step S5. This flow of transfer is as indicated by an arrow in FIG. 6.

Processing that is performed in step S1 if an error signal is output from the protective-film coating module (ITC) is next described taking the wafer 7 as an example. First, after the wafer W7 has been transferred to the protective-film coating module (ITC), if an error signal is output therefrom, the alarm unit 46 generates an alarm. In FIG. 7, the wafer 7 is encircled, which indicates that the alarm is occurring. It is next judged in step S7 whether a heating process in the heating module (BAKE) is specified. If this heating process is not specified, heating in the BAKE module is skipped. In this case, the wafer 7 is transferred to the inspection module (WIS) by the main transfer mechanism 25A and inspected in the WIS module in step S3. If the above heating process is specified, the wafer 7 is heated in the heating module (BAKE) in step S2. The wafer 7, after being heated, is transferred to the inspection module (WIS) by the main transfer mechanism 25A and inspected in the WIS module in step S3.

Next, whether the protective film is appropriately formed on the entire surface of the wafer 7 is judged in the inspection module (WIS) in step S4. However, the wafer 7 is judged abnormal. This is because the above error signal indicates that the wafer is defective, for example, in that the protective film is not appropriately formed on the surface, in that although formed on the entire surface of the wafer 7, the protective film spans such far as it reaches an edge thereof, or in that the wafer 7 has a section on the surface where the protective film is not formed. After the judgment, the wafer 7 in the inspection module (WIS) is transferred to downstream modules in order according to the transfer schedule shown in FIG. 7, but since this wafer is defective, the associated temperature control module (CPL1), the wafer edge exposure device (WEE), and the like are controlled not to process the wafer (step S8).

After that, the wafer 7 in the wafer edge exposure device (WEE) is transferred to the buffer (BUF), a queuing module, by the main transfer section 31A. Since the wafer 7 that has been transferred to the buffer (BUF) is defective, this wafer is not transferred to the temperature control module (ICPL), exposure device (EXP), and transfer module (TRS3) that are, as shown in FIG. 7, located downstream with respect to the buffer (BUF). Instead, the wafer 7 is queued in the buffer (BUF) in step S9. The wafer 7 remains queued in the buffer (BUF) until, as shown in FIG. 7, the wafer 6 immediately preceding the wafer 7 has been subjected to an exposure process in the exposure device (EXP) and transferred to the transfer module (TRS3) and in addition, the immediately preceding wafer 6 has been transferred from the transfer module (TRS3) to a heating module (PEB), that is, until step S10 has been executed.

In this way, the wafer 7 is queued in the buffer (BUF) for the following reason. That is to say, if the wafer 7 that has been transferred to the buffer (BUF) is immediately skipped through the exposure device (EXP) and the transfer module (TRS3) and transferred to the heating module (PEB), since the wafer 7 is loaded thereinto before the wafer 6 is so done, the order of transfer is reversed, which results in complex transfer control of the wafers. Once the wafer 6 immediately preceding the wafer 7 has been transferred to the heating module (PEB), a "YES" response is performed in step S10 and the wafer 7 in the buffer (BUF) is transferred to the heating module (PEB) by the main transfer section 31A. However, since the wafer 7 is defective, in step S11, this wafer is controlled not to be heated in the heating module (PEB). In the present example, transfer is performed in the above sequence because the heating module (PEB) is specified as the next transfer destination module for the defective wafer.

Next, the wafer 7 in the heating module (PEB) is transferred to the protective-film removing module (ITR) by the main transfer mechanism 25B in step S12. After this, if it is judged in the inspection module (WIS) that a protective film is not present on the wafer surface, this is followed by judging in step S13 whether a protective-film removing process is specified not to be performed. If the protective-film removing process is specified not to be performed, this is followed by judging in step S14 whether a protective film is present on the surface of the wafer 7. If a protective film is present on the wafer surface, the protective-film removing process is performed in step S15. If a protective film is not present on the wafer surface, the protective-film removing process is not performed. In the present example, the protective-film removing process is performed since the wafer 7 has a protective film on the surface.

In addition, if the protective-film removing process is specified not to be performed, this removing process is performed for all wafers W that have been judged abnormal, irrespective of whether the wafer W is defective. After the removing process, the wafer 7 in the protective-film removing module (ITR) is transferred to downstream modules in order according to the transfer schedule shown in FIG. 7, but since this wafer 7 is defective, the modules located downstream with respect to the protective-film removing module (ITR) are controlled not to process the wafer 7 (step S16).

Processing that will be performed if an error signal is not output from the protective-film coating module (ITC) and a defective wafer is detected in the inspection module (WIS) is next described taking the wafer 16 as an example. After going through above-described steps S1 to S3, the wafer 16 is inspected in the inspection module (WIS). Assume that as a result of the inspection in the inspection module (WIS), the wafer 16 is judged not to have a protective film appropriately formed on the surface. The wafer 16 is recognized as a defective wafer from the inspection results, and above-described steps S8 to S16 are also performed upon this wafer.

According to the embodiment described above, the wafer 7 (16) that has been judged abnormal by the inspection module (WIS) is transferred to the buffer (BUF) and then queued therein. Next after the wafer 6 (15) immediately preceding the wafer 7 (16) in terms of priority has been unloaded from the exposure device (EXP) and then loaded into the heating module (PEB), the wafer 7 (16) is transferred from the buffer (BUF) to the heating module (PEB). Subsequently, the order in which the immediately preceding wafer 6 (15) and the wafer 7 (16) are to be transferred is maintained. In addition, processing of the wafer 7 (16) in all other modules, except in the protective-film removing module (ITR), is skipped. For this reason, since the protective-film removing process for the wafer 7 (16) that has been judged abnormal is performed in the apparatus, no need arises for the apparatus to perform the protective-film removing process upon the defective wafer that has been recovered and returned to the carrier C. Furthermore, the normal wafers W1 to W6, W8 to W15, and W17 to W25 can be sequentially collected into the carrier C in order of the transfer priority without being adversely affected during processing. Furthermore, if a protective film is not formed on the surface of the wafer, an expensive separating solution (protective-film removing solution) can be saved by specifying the skipping of the protective-film removing process.

Moreover, the queuing position for the defective wafer is not limited to the buffer (BUF) provided in the interface unit B3, and as shown in FIG. 6, this queuing position can be, for example, in the transfer unit (TRS2) provided in the processing block B2. Besides, the module specified as that to which the defective wafer is to be transferred from the buffer (BUF) is not limited to the heating module (PEB).

What is claimed is:

1. A coating and developing apparatus, comprising:
    a resist-coating module that coats a surface of a substrate with a resist;
    a protective-film coating module provided at a downstream side relative to the resist-coating module, the protective-film coating module being adapted such that the resist film formed on the surface of the substrate is surface-coated with a chemical for forming a protective film to protect the surface of the substrate;
    an inspection module provided at a downstream side relative to the protective-film coating module, the inspection module being adapted to inspect a coating state of the chemical in the protective-film coating module;
    a queuing module provided at a downstream side relative to the inspection module, the queuing module being adapted to queue the substrate;
    a protective-film removing module provided at a downstream side relative to the queuing module, the protective-film removing module being adapted to remove the protective film from the substrate upon which a light exposure unit has performed liquid-immersion light exposure with a liquid layer formed on the surface of the substrate;
    a developing module provided at a downstream side relative to the protective-film removing module, the developing module being adapted to develop the substrate by supplying a developing solution to the substrate from which the protective film has been removed;
    substrate transfer means for sequentially transferring the substrate from an upstream module, towards a downstream module, and between the modules that constitute the apparatus; and
    a controller connected to each of the modules and to the substrate transfer means, the controller controlling the substrate transfer means in accordance with the coating state of the chemical that has been inspected in the inspection module;
    wherein:
    if an abnormal substrate is detected in the inspection module and transferred to the queuing module, the controller controls the queuing module to queue the abnormal substrate, and after a substrate immediately preceding the abnormal substrate in terms of transfer priority level has been unloaded from the exposure unit and loaded into a previously designated module present at an upstream side relative to the protective-film removing module and at a downstream side relative to the exposure unit, the controller controls the substrate transfer means to transfer the abnormal substrate from the queuing module to the designated module; and
    the controller further controls the substrate transfer means to transfer the immediately preceding substrate and the abnormal substrate towards a downstream side relative to the designated module to subsequently maintain the transfer priority levels of the immediately preceding substrate and the abnormal substrate, and controls the protective-film removing module to remove a protective film from the abnormal substrate in the protective-film removing module.

2. The coating and developing apparatus according to claim 1, wherein
    in the modules located downstream with respect to the inspection module, the controller controls each module, except for the protective-film removing module, not to perform processing of the abnormal substrate.

3. The coating and developing apparatus according to claim 1, wherein
    the queuing module is a buffer unit that adjusts any differences between a substrate-processing speed of each module at an upstream side of the exposure unit and a substrate-processing speed of the exposure unit itself.

4. The coating and developing apparatus according to claim 1, further comprising:
    a first heating module between the protective-film coating module and the inspection module to heat the protective film on the substrate;
    wherein the controller controls the first heating module not to perform the heating process upon an abnormal substrate whose abnormality has been detected during processing in the protective-film coating module.

5. The coating and developing apparatus according to claim 1, wherein
    the designated module is a second heating module provided at an upstream side relative to the developing module in order to heat the substrate prior to the development thereof in the developing module.

6. The coating and developing apparatus according to claim 1, wherein
    the controller controls the protective-film removing module not to perform the protective-film removal process upon an abnormal substrate which the inspection module has judged not to have the required protective film.

7. A method of operating a coating and developing apparatus which includes a resist-coating module that coats a surface of a substrate with a resist, a protective-film coating module provided at a downstream side relative to the resist-coating module such that the resist film formed on the surface of the substrate is surface-coated with a chemical for forming a protective film to protect the surface of the substrate, an inspection module provided at a downstream side relative to the protective-film coating module in order to inspect a coating state of the chemical in the protective-film coating module, a queuing module provided at a downstream side relative to the inspection module in order to queue the substrate, a protective-film removing module provided at a downstream side relative to the queuing module in order to remove the protective film from the substrate upon which a light exposure unit has performed liquid-immersion light exposure with a liquid layer formed on the surface of the substrate, a developing module provided at a downstream side relative to the protective-film removing module in order to develop the substrate by supplying a developing solution to the substrate from which the protective film has been removed, substrate transfer means for sequentially transferring the substrate from an upstream module, towards a downstream module, and between the modules that constitute the apparatus, and a controller connected to each of the modules and to the substrate transfer means to control the substrate transfer means in accordance with the coating state of the chemical that has been inspected in the inspection module, the operating method comprising the steps of:

coating the surface of the substrate with the resist in the resist-coating module;

coating, in the protective-film coating module, the resist film formed on the surface of the substrate, with a chemical for forming a protective film to protect the surface of the substrate;

inspecting in the inspection module the coating state of the chemical in the protective-film coating module;

queuing the substrate in the queuing module;

removing the protective film from the substrate in the protective-film removing module after liquid-immersion light exposure has been performed in the exposure unit with a liquid layer formed on the surface of the substrate; and developing the substrate by supplying the developing solution to the substrate from which the protective film has been removed;

wherein:

if an abnormal substrate is detected in the inspection module and transferred to the queuing module, the controller controls the queuing module to queue the abnormal substrate, and after a substrate immediately preceding the abnormal substrate in terms of transfer priority level has been unloaded from the exposure unit and loaded into a previously designated module present at the upstream side relative to the protective-film removing module and at a downstream side relative to the exposure unit, the controller controls the substrate transfer means to transfer the abnormal substrate from the queuing module to the designated module; and the controller further controls the substrate transfer means to transfer the immediately preceding substrate and the abnormal substrate towards a downstream side relative to the designated module to subsequently maintain the transfer priority levels of the immediately preceding substrate and the abnormal substrate, and controls the protective-film removing module to remove a protective film from the abnormal substrate in the protective-film removing module.

8. The method of operating a coating and developing apparatus according to claim 7, wherein except for the protective-film removing module, the modules located downstream with respect to the inspection module do not perform processing of the abnormal substrate.

9. The method of operating a coating and developing apparatus according to claim 7, wherein the queuing module is a buffer unit to adjust any differences between a substrate-processing speed of each module at an upstream side of the exposure unit and a substrate-processing speed of the exposure unit.

10. The method of operating a coating and developing apparatus according to claim 7, wherein a first heating module for heating the protective film on the substrate is provided between the protective-film coating module and the inspection module; and the controller controls the first heating module not to perform the heating process upon an abnormal substrate whose abnormality has been detected during processing in the protective-film coating module.

11. The method of operating a coating and developing apparatus according to claim 7, wherein the designated module is a second heating module provided at an upstream side relative to the developing module, the second heating module heating the substrate prior to the development thereof in the developing module.

12. The method of operating a coating and developing apparatus according to claim 7, wherein the protective-film removing module is controlled not to perform the protective-film removal process upon an abnormal substrate which the inspection module has judged not to have the required protective film.

13. A computer-readable storage medium including a computer program, the computer program performing a method of operating a coating and developing apparatus including:

a resist-coating module that coats a surface of a substrate with a resist, a protective-film coating module provided at a downstream side relative to the resist-coating module such that the surface of the resist film formed on the surface of the substrate is coated with a chemical for forming a protective film to protect the surface of the substrate, an inspection module provided at a downstream side relative to the protective-film coating module in order to inspect a coating state of the chemical in the protective-film coating module, a queuing module provided at a downstream side relative to the inspection module in order to queue the substrate, a protective-film removing module provided at a downstream side relative to the queuing module in order to remove the protective film from the substrate upon which a light exposure unit has performed liquid-immersion light exposure with a liquid layer formed on the surface of the substrate, a developing module provided at a downstream side relative to the protective-film removing module in order to develop the substrate by supplying a developing solution to the substrate from which the protective film has been removed, substrate transfer means for sequentially transferring the substrate from an upstream module, towards a downstream module, and between the modules that constitute the apparatus, and a controller connected to each of the modules and to the substrate transfer means to control the substrate transfer means in accordance with the coating state of the chemical that has been inspected in the inspection module, the operating method comprising the steps of:

coating the surface of the substrate with the resist in the resist-coating module;

coating, in the protective-film coating module, the resist film formed on the surface of the substrate, with a chemical for forming a protective film to protect the surface of the substrate;

inspecting in the inspection module the coating state of the chemical in the protective-film coating module;

queuing the substrate in the queuing module;

removing the protective film from the substrate in the protective-film removing module after liquid-immersion light exposure has been performed in the exposure unit with a liquid layer formed on the surface of the substrate; and developing the substrate by supplying the developing solution to the substrate from which the protective film has been removed;

wherein:

if an abnormal substrate is detected in the inspection module and transferred to the queuing module, the controller controls the queuing module to queue the abnormal substrate, and after a substrate immediately preceding the abnormal substrate in terms of transfer priority level has been unloaded from the exposure unit and loaded into a previously designated module present at the upstream side relative to the protective-film removing module and at a downstream side relative to the exposure unit, the controller controls the substrate transfer means to transfer the abnormal substrate from the queuing module to the designated module; and the controller further controls the substrate transfer means to transfer the immediately preceding substrate and the abnormal substrate towards a downstream side relative to the designated module so as to subsequently maintain the transfer priority levels of the immediately preceding substrate and the abnormal substrate, and controls the protective-film removing module to remove a protective film from the abnormal substrate in the protective-film removing module.

* * * * *